(12) United States Patent
Nataraj et al.

(10) Patent No.: US 8,730,704 B1
(45) Date of Patent: May 20, 2014

(54) CONTENT ADDRESSABLE MEMORY ARRAY HAVING LOCAL INTERCONNECTS

(75) Inventors: Bindiganavale S. Nataraj, Cupertino, CA (US); John Zimmer, Gilroy, CA (US); Sandeep Khanna, Los Altos, CA (US); Vinay Iyengar, Cupertino, CA (US); Chetan Deshpande, San Jose, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 0 days.

(21) Appl. No.: 13/371,236

(22) Filed: Feb. 10, 2012

(51) Int. Cl.
*G11C 15/00* (2006.01)
(52) U.S. Cl.
USPC .................. 365/49.17; 365/49.1; 365/189.07
(58) Field of Classification Search
CPC ...... G11C 15/04; G11C 15/00; G11C 15/046; G11C 15/043

USPC .................. 365/49.17, 49.1, 189.07, 49.18; 711/108
See application file for complete search history.

(56) References Cited

U.S. PATENT DOCUMENTS

| | | | | |
|---|---|---|---|---|
| 6,678,184 B2 * | 1/2004 | Lysinger et al. | ........... | 365/49.17 |
| 7,286,379 B1 * | 10/2007 | Sun | ........... | 365/49.17 |
| 7,304,874 B2 * | 12/2007 | Venkatraman et al. | ...... | 365/49.1 |

* cited by examiner

*Primary Examiner* — David Lam
(74) *Attorney, Agent, or Firm* — Sterne, Kessler, Goldstein & Fox P.L.L.C.

(57) ABSTRACT

A CAM device is disclosed that includes an array of CAM cells in which the compare circuits of groups of CAM cells are connected together using a conductive layer interposed between a polysilicon layer of the CAM device and the metal-1 layer of the CAM device. This allows the data lines (e.g., the bit lines and/or comparand lines) of the CAM array to be formed in the metal-1 layer of the CAM device, which in turn allows the match lines of the CAM array to be formed in the metal-2 layer of the CAM device. The conductive layer, which may be a silicide layer, is connected to the match line by a via extending from the conductive layer through the metal-1 layer to the metal-2 layer.

25 Claims, 6 Drawing Sheets

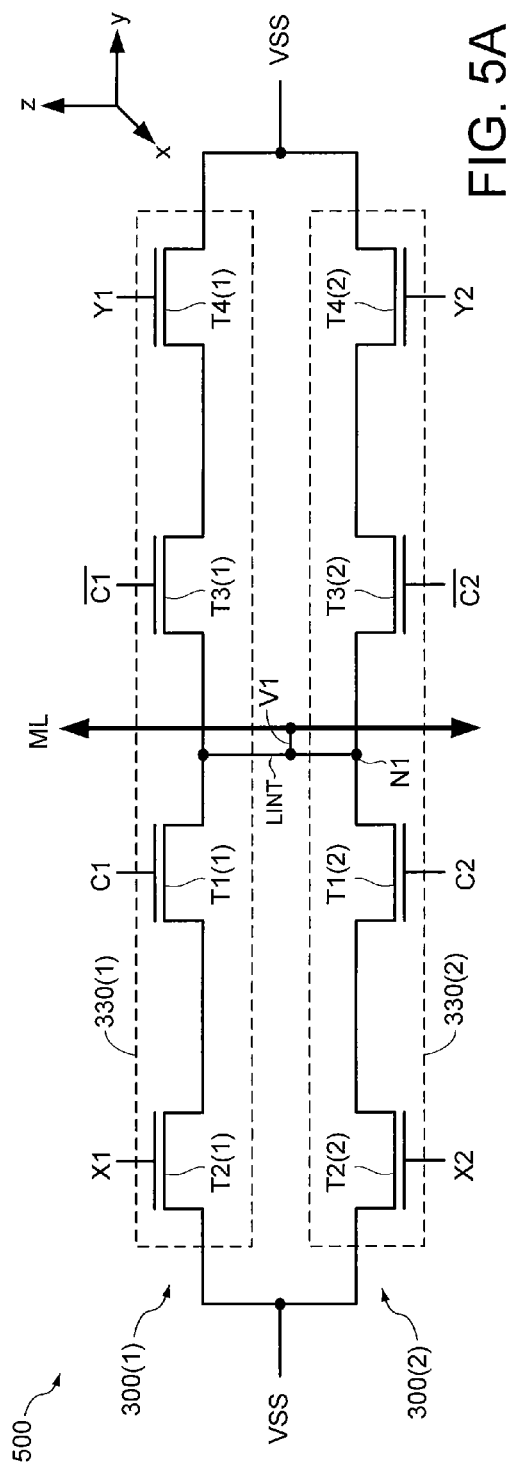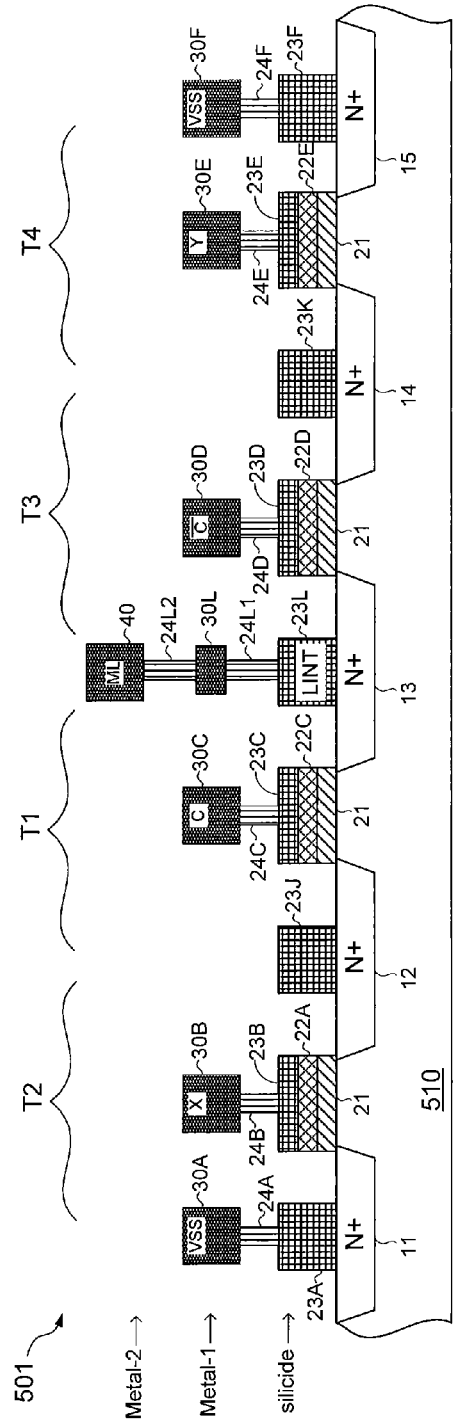
FIG. 5A
FIG. 5B

CONTENT ADDRESSABLE MEMORY ARRAY HAVING LOCAL INTERCONNECTS

TECHNICAL FIELD

The present embodiments generally relate to content addressable memory (CAM) devices, and more particularly to the design and layout of CAM cells.

BACKGROUND

Content addressable memory (CAM) devices are frequently used in network switching and routing applications to determine forwarding destinations for data packets. A CAM device can be instructed to compare a selected portion of an incoming packet (e.g., a destination address extracted from the packet header) with CAM words (e.g., forwarding address) stored in an array within the CAM device. If there is a matching entry stored in the CAM array, the index of the matching CAM word can be used to access a corresponding location in an associated memory device to retrieve a destination address and/or other routing information for the packet.

More specifically, a CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match result. If any of the match lines are asserted, a match flag is asserted to indicate the match condition, and a priority encoder determines the match address or index of the highest priority matching entry in the CAM array.

Typically, local routing lines that provide electrical connections between components of adjacent CAM cells are formed in the metal-1 layer of the CAM device, the data lines (e.g., the comparand lines and/or the bit lines) of the CAM array are formed in the metal-2 layer of the CAM device, and the match lines are formed in the metal-3 layer of the CAM device. Unfortunately, forming the data lines in the metal-2 layer causes such data lines to have an undesirably high capacitance, which in turn results in undesirably high power consumption. In addition, as semiconductor device geometries decrease, power consumption plays an increasingly important role in the design, fabrication, and operation of CAM devices. Thus, it would be desirable to reduce the power consumption of CAM devices while also increasing the ability to scale such CAM devices with smaller process geometries.

BRIEF DESCRIPTION OF THE DRAWINGS

The present embodiments are illustrated by way of example, and not by way of limitation, in the figures of the accompanying drawings and in which like reference numerals refer to similar elements and in which:

FIG. 5A is a circuit diagram depicting an exemplary layout of the transistors of the compare circuits of the XY CAM cells of FIG. 4 in accordance with some embodiments;

FIG. 5B is a cross-sectional view of the two CAM cell compare circuits of FIG. 4 along the y-axis in accordance with some embodiments.

DETAILED DESCRIPTION

Figure 1:
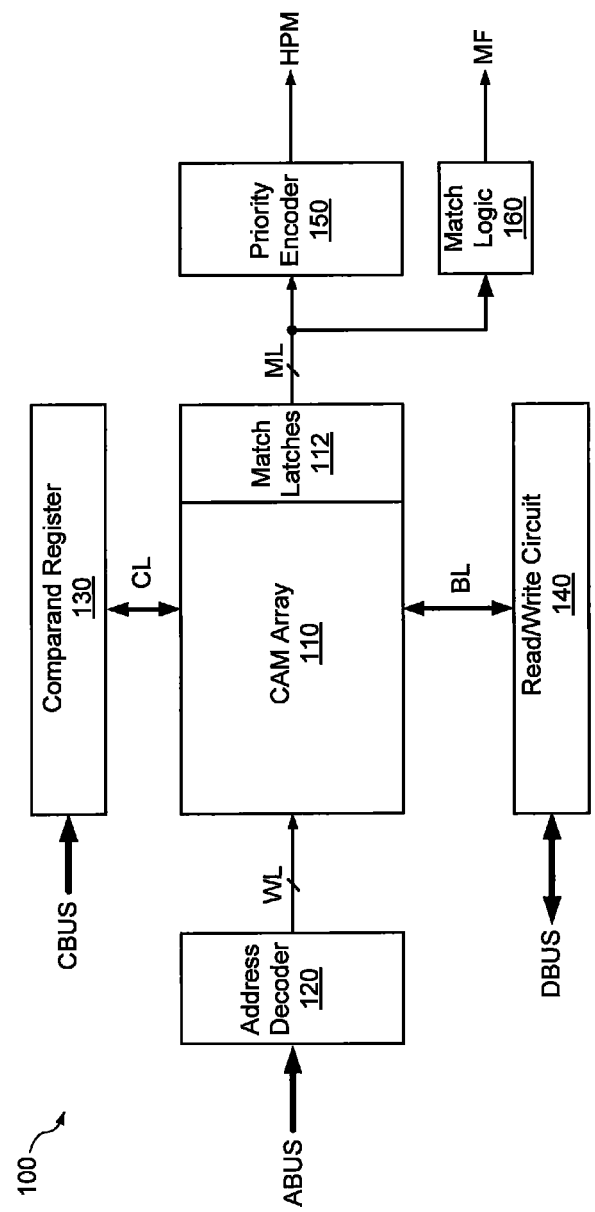
FIG. 1 is a block diagram of a CAM device within which the present embodiments may be implemented.

A CAM device is disclosed that includes an array of CAM cells in which the compare circuits of groups of CAM cells are connected together using a conductive layer interposed between a polysilicon layer of the CAM device and the metal-1 layer of the CAM device. In the following description, for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present embodiments unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather include within their scope all embodiments defined by the appended claims.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As mentioned above, a CAM device is disclosed that includes an array of CAM cells in which the compare circuits of groups of CAM cells are connected together using a conductive layer interposed between a polysilicon layer of the CAM device and the metal-1 layer of the CAM device. This allows the data lines (e.g., the bit lines and/or comparand lines) of the CAM array to be formed in the metal-1 layer of the CAM device, which in turn allows the match lines of the CAM array to be formed in the metal-2 layer of the CAM device. The conductive layer, which for some embodiments may be a silicide layer, is connected to the match line by a via extending from the conductive layer through the metal-1 layer to the metal-2 layer. By forming the data lines in the metal-1 layer, the capacitance of such data lines is reduced (e.g., as compared to data lines formed in the metal-2 layer), which in turn advantageously reduces the power consumption of the CAM device. In addition, forming the data lines in the metal-1 layer and forming the match lines in the metal-2 layer may also improve the ability to scale such CAM devices to smaller semiconductor process geometries.

FIG. 1 is a block diagram of a CAM device within which the present embodiments may be implemented. CAM device 100 includes a CAM array 110, an address decoder 120, a comparand register 130, a read/write circuit 140, a priority encoder circuit 150, and match logic 160. CAM array 110 includes any number of rows of CAM cells (not shown for simplicity in FIG. 1), where each row of CAM cells can be configured to store a data word. Further, while CAM array 110 is shown in FIG. 1 as a single CAM array, it may include any number of CAM array blocks that can be independently searched.

One or more instructions and related control signals may be provided to CAM device 100 from an instruction decoder (not shown for simplicity) to control read, write, compare, and other operations for CAM device 100. Other well-known signals that can be provided to CAM device 100, such as enable signals, clock signals, and power connections, are not shown for simplicity. Further, although not shown in FIG. 1, each row of CAM cells in CAM array 110 may have one or more validity bits to indicate whether the corresponding row (or any segment thereof) of CAM cells stores valid data.

Each row of CAM cells (not shown in FIG. 1 for simplicity) in CAM array 110 is coupled to address decoder 120 via a corresponding word line WL, and to match latches 112, to priority encoder 150, and to well-known match logic 160 via a corresponding match line ML. For simplicity, the word lines and match lines are represented collectively in FIG. 1. Address decoder 120 is well-known, and includes circuitry to select corresponding rows in CAM array 110 for read, write, and/or other operations in response to an address received from an address bus ABUS using the word lines WL. For other embodiments, addresses may be provided to address decoder 120 from another suitable bus and/or circuitry.

The match lines ML provide match results for compare operations between comparand data (e.g., a search key) and data stored in CAM array 110. Priority encoder 150, which is well-known, uses the match results indicated on the match lines and latched in the match latches 112 to determine the matching entry that has the highest priority number associated with it and generates the index or address of this highest priority match (HPM). In addition, priority encoder 150 may use the validity bits from CAM array 110 to generate the next free address that is available in CAM array 110 for storing new data. Although not shown in FIG. 1, for some embodiments, priority encoder 150 may provide the next free address to the address decoder 120.

Match logic 160, which is well-known, uses the match results indicated on the match lines to generate a match flag (MF) indicative of a match condition in CAM array 110. If there is more than one matching entry in CAM array 110, match logic 160 may generate a multiple match flag MMF to indicate a multiple match condition. In addition, match logic 160 may use the validity bits from CAM array 110 to assert a full flag when all of the rows of CAM cells in CAM array 110 are filled with valid entries.

Each column of CAM cells (not shown in FIG. 1 for simplicity) in CAM array 110 is coupled to comparand register 130 via one or more corresponding comparand lines CL, and is coupled to read/write circuit 140 via one or more corresponding bit lines BL. For simplicity, the comparand lines CL and bit lines BL are represented collectively in FIG. 1. Comparand register 130 is well-known, and is configured to provide a search key (e.g., a comparand word) received from a comparand bus CBUS to CAM array 110 during compare operations with data stored therein. For other embodiments, the search key can be provided to CAM array 110 via another bus and/or circuit. Read/write circuit 140 includes well-known write drivers to write data received from a data bus DBUS to CAM array 110 via the bit lines BL, and includes well-known sense amplifiers to read data from CAM array 110 onto DBUS. For other embodiments, read/write circuit 140 may be coupled to a bus other than DBUS. Further, although not shown in FIG. 1 for simplicity, CAM device 100 can include a well-known global mask circuit (e.g., coupled to the comparand register 130) that can selectively mask the bits of the search key provided to the CAM array 110.

Figure 2:
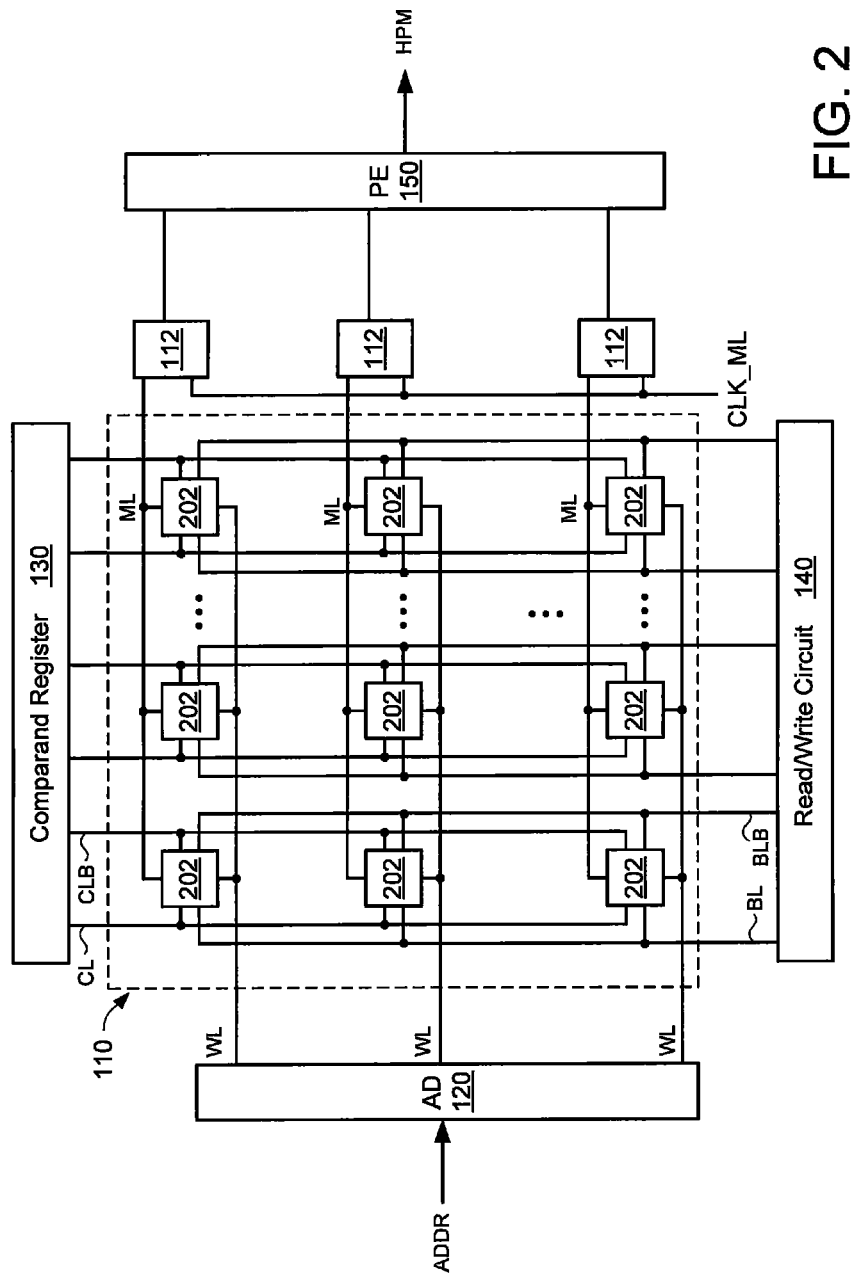
FIG. 2 is a block diagram of one embodiment of the CAM array of FIG. 1.

FIG. 2 is a more detailed block diagram of the CAM array 110 of FIG. 1. CAM array 110 is shown to include a plurality of CAM cells 202 organized in any number of rows and columns. The CAM cells 202 can be any suitable type of CAM cell including, for example, binary CAM cells, ternary CAM cells, and/or quaternary CAM cells. As noted above, each row of CAM array 110 may also include one or more validity bits (not shown for simplicity). Each row of CAM cells 202 is coupled to a match line ML and to a word line WL. Each word line WL is driven by address decoder 120 (see also FIG. 1) to select one or more rows of CAM cells 202 for writing or reading. Each match line ML is coupled to priority encoder 150 via a corresponding match latch 112. The match latches 112 are clocked by a match latch clock signal CLK_ML in a well-known manner. Each column of CAM cells 202 in CAM array 110 is coupled to read/write circuit 140 via a complementary bit line pair BL/BLB, and to comparand register 130 via a complementary comparand line pair CL/CLB.

Prior to compare operations, the match lines ML are precharged (e.g., to logic high), and each set of complementary comparand line pairs CL/CLB is driven to the same predetermined logic level (e.g., to logic high). Then, during compare operations, the comparand register 130 provides the search key (i.e., the comparand word) to the CAM cells 202 by driving each pair of complementary comparand lines CL/CLB to opposite logic states indicative of the corresponding bit of the search key. For example, to provide a logic low comparand bit (C) to a column of CAM cells, the corresponding comparand line CL is driven to a first logic state (e.g., logic low) and the corresponding complementary comparand line CLB is driven to a second logic state (e.g., logic high); conversely, to provide a logic high comparand bit C to the column of CAM cells, the corresponding comparand line CL is driven to the second logic state (e.g., logic high) and the corresponding complementary comparand line CLB is driven to the first logic state (e.g., logic low). Thereafter, if all the CAM cells 202 in a particular row match the corresponding bits of the search key, then the match line ML remains in its logic high state to indicate the match condition. Conversely, if one or more of the CAM cells 202 in the row do not match the corresponding bit of the search key, then mismatching CAM cells 202 discharge the match line (e.g., to ground potential) to indicate the mismatch condition.

Figures 3A, 3B:
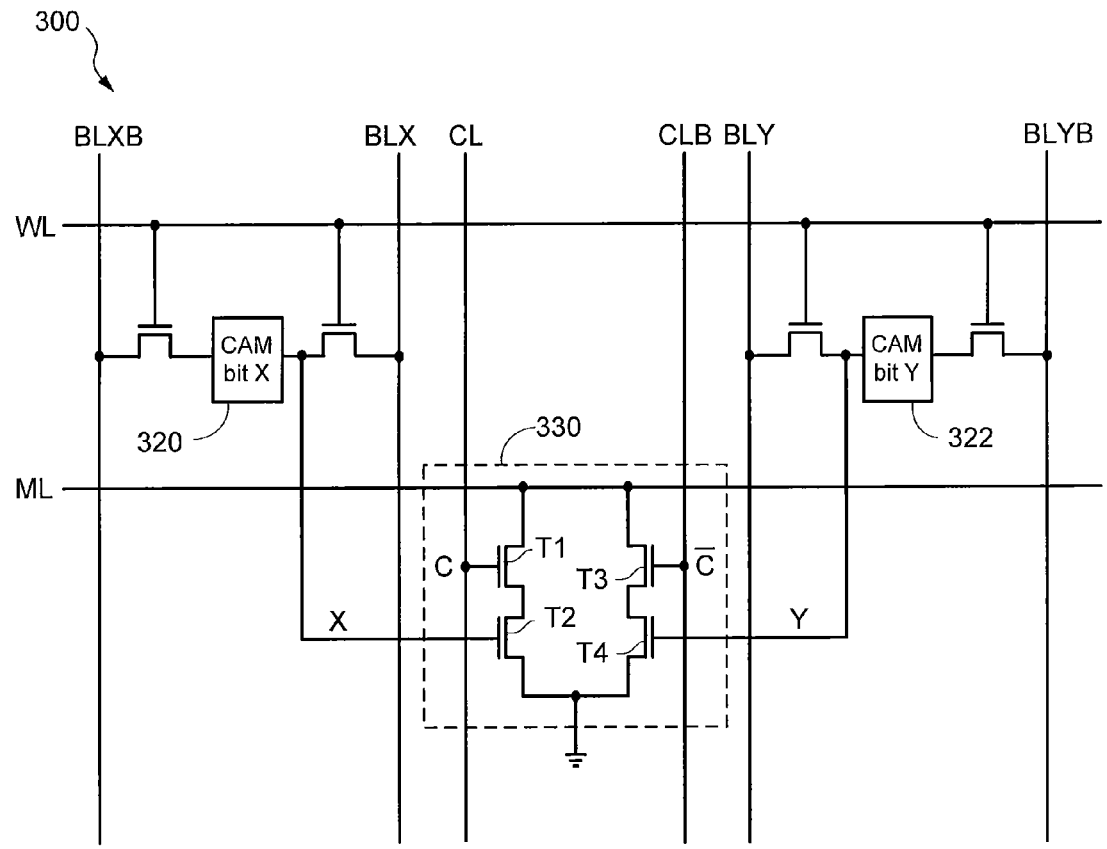
FIG. 3A is circuit diagram of a quaternary (XY) CAM cell.
FIG. 3B shows a truth table for data storage in the XY CAM cell of FIG. 3A.

FIG. 3A shows a quaternary CAM cell 300 that is one embodiment of CAM cells 202 of FIG. 2. Quaternary CAM cell 300, which is also commonly referred to as an XY CAM cell, include two storage elements 320 and 322 coupled to a compare circuit 330. The first storage element 320 stores a first data bit X, and the second storage element 322 stores a second data bit Y. The compare circuit 330 includes a first discharge path between the match line ML and ground potential formed by series-connected pull-down transistors T1-T2, and includes a second discharge path between the match line ML and ground potential formed by series-connected pull-down transistors T3-T4. The gate of transistor T1 is coupled to the comparand line CL to receive the comparand bit C, the gate of transistor T2 is coupled to first storage element 320 to receive the X bit, the gate of transistor T3 is coupled to the complementary comparand line CLB to receive the complemented comparand bit $\overline{C}$, and the gate of transistor T4 is coupled to second storage element 322 to receive the Y bit.

The two data bits X and Y can collectively represent four possible states: "0", "1", "don't care", and a fourth state which may be left unused or may indicate "invalid," as depicted in FIG. 3B. The logic "0" and "1" states correspond to the logic states represented, for example, by a conventional binary CAM cell. For each of these states, if the comparand data (e.g., provided to CAM cell 300 via complementary comparand lines CL and CLB) matches the data stored in CAM cell 300, compare circuit 330 does not discharge the match line ML, which indicates a match condition (e.g., by remaining in its pre-charged state). Conversely, if the comparand data does not match the data stored in CAM cell 300, compare circuit 330 discharges match line ML (e.g., toward ground potential) to indicate the mismatch condition. For the "don't care" state, the logic low values for X and Y maintain respective transistors T2 and T4 in non-conductive states, thereby preventing compare circuit 330 from discharging match line ML. In this manner, data stored in CAM cell 300 is masked from the compare operation, thereby forcing a match condition for CAM cell 300, regardless of the comparand data. For the "invalid" state, the logic high values for X and Y maintain respective transistors T2 and T4 in conductive states. During a compare operation, one of the complementary comparand data bit pair provided on CL/CLB will be logic high, thereby causing compare circuit 330 to discharge match line ML to indicate the mismatch state, regardless of the comparand data.

Figure 4:
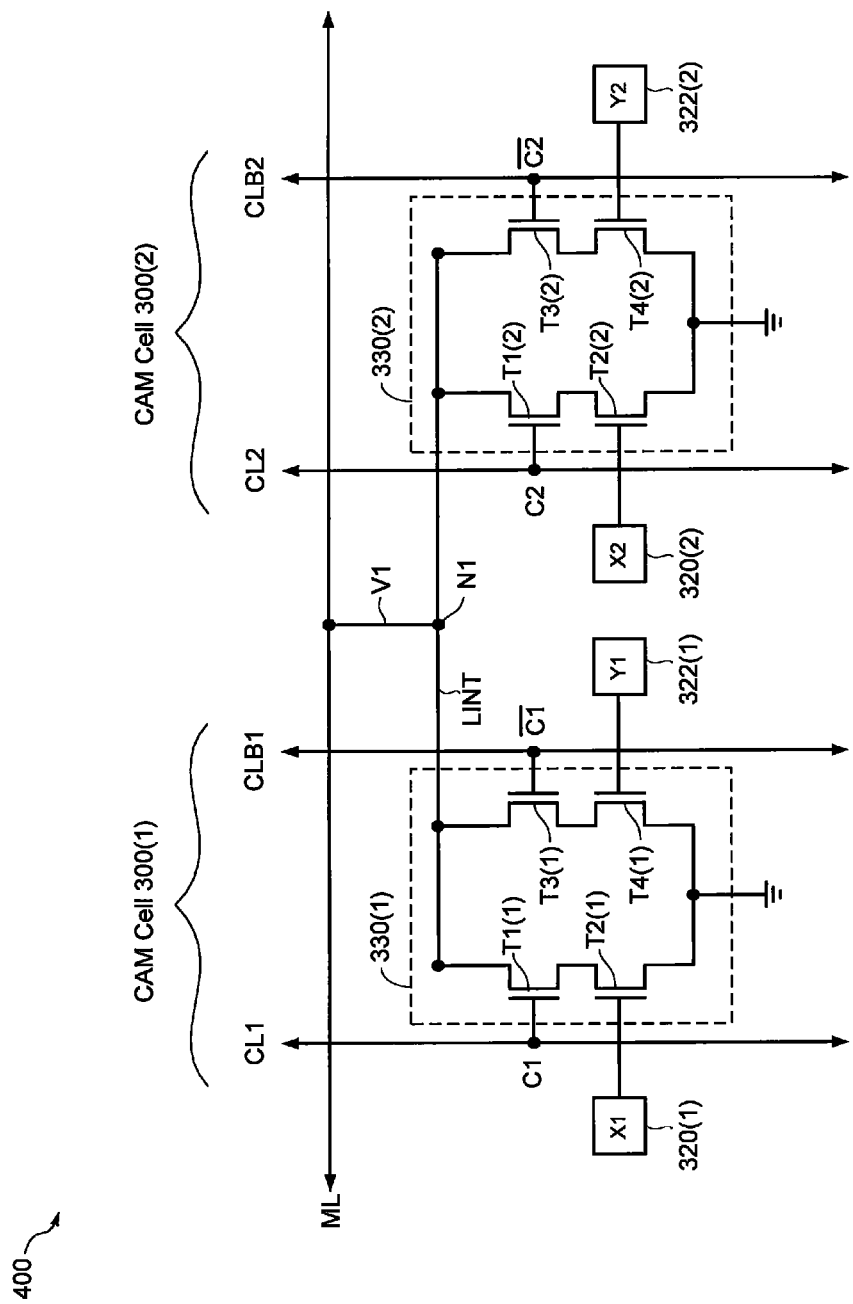
FIG. 4 is a circuit diagram of two adjacent XY CAM cells having compare circuits connected together with a local interconnect in accordance with the present embodiments.

FIG. 4 is a circuit diagram illustrating a portion of a CAM row 400 in accordance with the present embodiments. CAM row 400, which can be deployed in CAM arrays of the type described above with respect to FIGS. 1-2, is shown to include a pair of CAM cells 300(1) and 300(2) of the type described above with respect to FIG. 3A, except for the inclusion of a local interconnect line (LINT) that is discussed in more detail below. For simplicity, only two CAM cells 300(1) and 300(2) are shown in row 400 of FIG. 4. Of course, for actual embodiments, CAM row 400 can include any number of CAM cells 300. Further, for simplicity, only the storage elements 320/322 and the compare circuits 330 of CAM cells 300(1)-300(2) are shown in FIG. 4, along with the row's match line ML and corresponding comparand line pairs CL1/CLB1 and CL2/CLB2. In addition, while CAM cells 300(1)-300(2) are depicted as quaternary CAM cells in FIG. 4, in alternate embodiments the CAM cells 300 may be other suitable types of CAM cells (e.g., binary or ternary CAM cells) having compare circuits similar to that illustrated in FIG. 4.

As shown in FIG. 4, compare circuit 330(1) of first CAM cell 300(1) is to compare a first comparand value represented by complementary comparand bits C1/$\overline{C1}$ with a first data value represented by data bits X1 and Y1. Similarly, compare circuit 330(2) of second CAM cell 300(2) is to compare a second comparand value represented by complementary comparand bits C2/$\overline{C2}$ with a second data value represented by data bits X2 and Y2. If either of the comparand values does not match the corresponding data value, then the compare circuit 330 of the corresponding CAM cell 300 discharges the match line ML to ground potential. Conversely, if both comparand values match their corresponding data values, then the compare circuits 330 of CAM cells 300 do not discharge the match line ML to ground potential.

More specifically, compare circuit 330(1) of first CAM cell 300(1) is shown as having a first discharge path including pull-down transistors T1(1) and T2(1) connected in series between a local interconnect (LINT) and ground potential, and as having a second discharge path including pull-down transistors T3(1) and T4(1) connected in series between local interconnect (LINT) and ground potential. The gate of transistor T1(1) receives C1 from comparand line CL1, the gate of transistor T2(1) receives the X1 bit from storage element 320(1), the gate of transistor T3(1) receives $\overline{C1}$ from complementary comparand line CLB1, and the gate of transistor T4(1) receives the Y1 bit from storage element 322(1). Similarly, compare circuit 330(2) of second CAM cell 300(2) is shown as having a first discharge path including pull-down transistors T1(2) and T2(2) connected in series between LINT and ground potential, and as having a second discharge path including pull-down transistors T3(2) and T4(2) connected in series between LINT and ground potential. The gate of transistor T1(2) receives C2 from comparand line CL2, the gate of transistor T2(2) receives the X2 bit from storage element 320(2), the gate of transistor T3(2) receives $\overline{C2}$ from complementary comparand line CLB2, and the gate of transistor T4(2) receives the Y2 bit from storage element 322(2).

The local interconnect (LINT), which connects the compare circuits 330(1) and 330(2) of respective CAM cells 300(1) and 300(2) together, is connected to the row match line ML at node N1 by a conductive via V1. In this manner, the drain regions of pull-down transistors T1(1), T3(1), T1(2), and T3(2) are connected to the local interconnect (LINT), which in turn is connected to the row match line ML by the via V1. In other words, the compare circuits 330(1) and 330(2) of respective CAM cells 300(1) and 300(2) are not connected directly to the row match line ML but instead are coupled to the row match line ML through the local interconnect (LINT). Note that node N1 corresponds to the outputs of compare circuits 330(1) and 330(2).

In accordance with the present embodiments, the local interconnect (LINT) is formed in a conductive layer interposed between a polysilicon layer of the associated CAM device and a metal-1 layer of the device. The term metal-1 in this context refers to the lowest metal layer in a stack of metal layers and intervening insulating, or dielectric, layers fabricated above the silicon and polysilicon layers, and thus the first metal layer situated above the semiconductor substrate. As a result, the comparand lines (e.g., CL1/CLB1 and CL2/CLB2) of row 400 can be formed in the metal-1 layer of the device, and the row match line ML of row 400 can be formed in the metal-2 layer of the device. For some embodiments, the bit lines BL associated with CAM arrays having a number of CAM rows 400 can also be formed in the metal-1 layer of the device. By forming the comparand lines in the metal-1 layer (rather than in the metal-2 layer), the comparand lines can be more easily connected to the polysilicon terminals for the gates of pull-down transistors T1 and T3 of compare circuits 330(1) and 330(2) because there is not any intermediate metal layer between the comparand lines and the gates of compare circuit pull-down transistors T1 and T3. Further, because there is not any intermediate metal layer between the comparand lines and the gates of such pull-down transistors of CAM cells 300 fabricated in accordance with the present embodiments, the capacitance of the comparand lines may be significantly less than prior approaches in which the comparand lines are formed in the metal-2 layer.

Figure 5C:
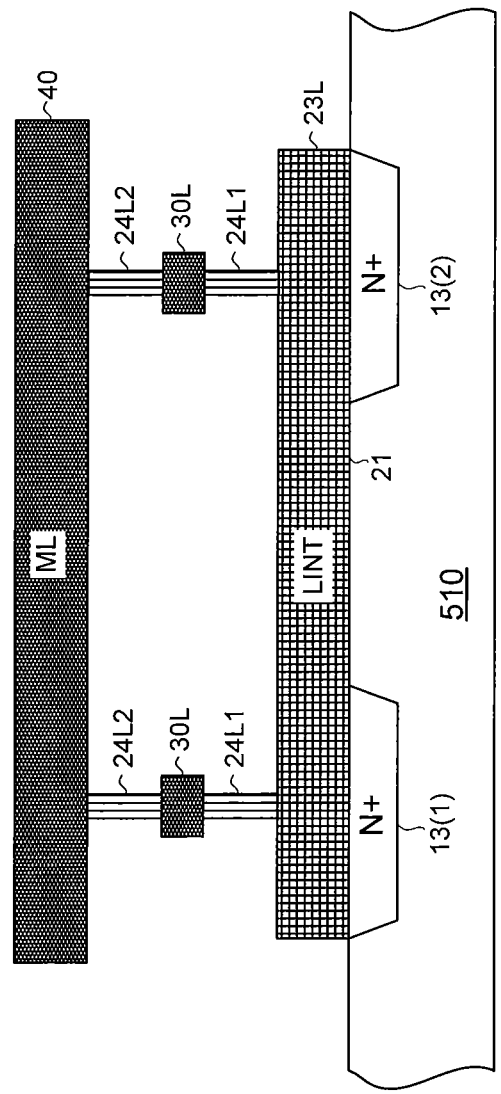
FIG. 5C is a cross-sectional view of the two CAM cell compare circuits of FIG. 4 along the x-axis in accordance with some embodiments.

FIG. 5A shows a circuit layout 500 depicting the compare circuits 330(1) and 330(2) of respective adjacent CAM cells 300(1) and 300(2) connected together by the local interconnect (LINT), which in turn is connected to the row match line ML by conductive via V1 at node N1, which as mentioned above corresponds to the outputs of compare circuits 330(1) and 330(2). Although portions of only two CAM cells 300(1) and 300(2) are shown in FIG. 5A for simplicity, it is to be understood that CAM rows in accordance with actual embodiments can include any suitable number of CAM cells 300. As shown in FIG. 5A, the drains of pull-down transistors T1(1) and T3(1) of first compare circuit 330(1) are connected together at node N1, and the drains of pull-down transistors T1(2) and T3(2) of second compare circuit 330(2) are connected together at node N1. For some embodiments, the drains of pull-down transistors T1(1) and T3(1) share a first diffusion region, and the drains of pull-down transistors T1(2) and T3(2) share a second diffusion region, for example, as described in more detail below with respect to the exemplary embodiment of FIG. 5B. Further, the common drains of transistors T1(1) and T3(1) of first compare circuit 330(1) are connected to the common drains of transistors T1(2)-T3(2) of second compare circuit 330(2) by the local interconnect LINT, which as mentioned above can be formed in a conductive layer interposed between the polysilicon layer and the metal-1 layer of the device. The local interconnect LINT is connected to the row match line ML by conductive via V1. For some embodiments, the row match line ML is formed in the metal-2 layer, and via V1 extends from the conductive layer through the metal-1 layer to the metal-2 layer, for example, as described in more detail below with respect to the exemplary embodiments of FIGS. 5B and 5C.

FIG. 5B shows a device cross-sectional view 501 across the compare transistors T2, T1, T3, and T4 for one embodiment of the compare circuits 330(1) or 330(2) of respective CAM cells 300(1) and 300(2) with the layout 500 in FIG. 5A, taken along the y-axis depicted in FIG. 5A. FIG. 5C shows a cross-sectional view 502 of the layout 500 of the compare circuit depicted in FIG. 5A, taken along the y-axis (at the LINT) as depicted in FIG. 5A. The compare circuit 501 is formed in a p-type semiconductor substrate 510 having a plurality of N+ diffusion regions 11-15 formed therein. For some embodiments, the N+ diffusion regions can be formed in one or more P-type well regions (not shown for simplicity). For the exemplary embodiment of FIG. 5B, a number of the N+ diffusion regions 11-15 can be shared by adjacent transistors (T) that form compare circuits 330 of corresponding CAM cells 300 depicted in FIG. 5A. Alternatively, in other embodiments, the transistors may not share the same diffusion region, but rather utilized isolated diffusion regions. For example, diffusion region 11 serves as a source region of transistor T2, diffusion region 12 serves as a drain region of transistor T2 and as a source region of transistor T1, diffusion region 13 serves as a common drain region of transistors T1 and T3, diffusion region 14 serves as a source region of transistor T3 and as a drain region of transistor T4, and diffusion region 15 serves as a source region of transistor T4. A layer of gate oxide 21 isolates substrate 510 and a layer of polysilicon 22 that forms the gate terminals of transistors T1-T4. A conductive layer 23 such as silicide is formed upon the polysilicon layer 22 to provide local electrical connections between adjacent transistors and/or between transistor terminals and one or more metal layers (e.g., metal-1 and metal-2 layers) of the semiconductor device, as described in more detail below. The silicide layer 23 can be formed using well-known techniques, for example, by depositing a reactive metal such as Tungsten over the polysilicon layer 22, and then applying rapid thermal annealing (RTA) techniques to cause the reactive metal and polysilicon to react and form the silicide layer. For some embodiments, the silicide layer 23 can be formed using techniques similar to that disclosed in U.S. Pat. No. 5,719,079, the entirety of which is incorporated by reference herein. For purposes of discussion herein, the terms "conductive layer" and "silicide layer" refer to layer 23 and may be used interchangeably, even though for other embodiments the conductive layer 23 may be formed using a material other than silicide.

As depicted in FIG. 5B, a number of first conductive vias 24A-24F provide electrical connections between selected portions of conductive layer 23 and selected portions of a metal-1 layer 30 formed above the conductive layer 23, and a number of second conductive vias 24L1-24L2 provide electrical connections between selected portions of conductive layer 23 and selected portions of a metal-2 layer 40 that provides routing lines for the match lines ML. For simplicity, dielectric layers (e.g., formed using suitable oxide materials such as silicon dioxide or using low-k dielectrics) that provide isolation between the conductive layers and/or between the one or more metal layers are not shown for simplicity. Further, the vias 24L1-24L2 shown in the cross-sectional views of FIGS. 5B-5C correspond to the via V1 shown in the circuit layout of FIG. 5A.

The metal-1 layer 30 provides conductive traces for electrical connections to VSS (e.g., ground potential), provides conductive traces for electrical connections between pull-down transistors T2 and T4 in compare circuits 330 to the storage elements of corresponding CAM cells 300, and provides conductive traces for electrical connections between pull-down transistors T1 and T3 in compare circuits 330 to the comparand lines CL/CLB. More specifically, the source region 11 of transistor T2 is connected to VSS by silicide portion 23A, via 24A, and metal-1 layer portion 30A. The polysilicon gate terminal 22B of transistor T2 is connected to the X storage element of CAM cell 300 by silicide portion 23B, via 24B, and metal-1 layer portion 30B. The polysilicon gate terminal 22C of transistor T1 is connected to the comparand line CL (e.g., to receive the C bit) by silicide portion 23C, via 24C, and metal-1 layer portion 30C. The polysilicon gate terminal 22D of transistor T3 is connected to the complementary comparand line CLB (e.g., to receive the C bit) by silicide portion 23D, via 24D, and metal-1 layer portion 30D. The polysilicon gate terminal 22E of transistor T4 is connected to the Y storage element of CAM cell 300 by silicide portion 23E, via 24E, and metal-1 layer portion 30E. Lastly, the source region 15 of transistor T4 is connected to VSS by silicide portion 23F, via 24F, and metal-1 layer portion 30F.

As discussed above with respect to FIG. 5A, in accordance with the present embodiments, the common drain region of transistors T1(1) and T3(1) of first compare circuit 330(1) is connected to the common drain region of transistors T1(2) and T3(2) of second compare circuit 330(2) by the LINT formed in the conductive silicide layer. More specifically, FIG. 5B shows the common drain region 13 of adjacent transistors T1 and T3 of a respective compare circuit 330 being connected to the row match line ML formed in the metal-2 layer 40 by silicide portion 23L and vias 24L1-24L2, and FIG. 5C shows the common drain region 13(1) of transistors T1(1) and T3(1) of first compare circuit 330(1) connected to the common drain region 13(2) of transistors T1(2) and T3(2) of second compare circuit 330(2) by the LINT formed in the conductive silicide layer 23L, which in turn is connected to the row match line ML formed in metal-2 layer 40 by conductive vias 24L1-24L2. More specifically, a first via 24L1 is connected between conductive silicide layer 23L and a land pad 30L formed in the metal-1 layer, and a second via 24L2 is connected between land pad 30L and the match line ML formed in metal-2 layer 40.

While FIG. 5C shows the LINT silicide layer 23L directly on top of the substrate 510 in the region outside of the drain regions 13(1) and 13(2), in practice an insulating layer (e.g., a field oxide) separates the substrate 510 from the LINT. Also, while FIG. 5B shows the silicide layer directly contacting the source/drain regions of the transistors T1-T4, in some embodiments the silicide layer is in series with a metallic plug (e.g., a tungsten plug) that contacts the source/drain regions.

Note that silicide portion 23L forms the LINT between the compare circuits 330(1) and 330(2) of respective adjacent CAM cells 300(1) and 300(2), and that vias 24L1-24L2 electrically connect silicide layer 23L to the metal-2 layer (e.g., without connecting to the metal-1 layer), thereby electrically connecting diffusion region 13 with the row match line ML formed in the metal-2 layer 40. Thus, in accordance with the present embodiments, the LINT formed by silicide layer 23L, which connects the compare circuits 330(1) and 330(2) of respective adjacent CAM cells 300(1) and 300(2) together, is connected to the row match line ML formed in the metal-2 layer 40 by conductive vias 24L1-24L2. In this manner, the LINT is formed in conductive (e.g., silicide) layer 23 interposed between the polysilicon layer 22 and the metal-1 layer 30 of the device. As a result, the comparand lines (e.g., CL1/CLB1 and CL2/CLB2) of the CAM array can be formed in the metal-1 layer 30 of the device, and the row match lines ML of the CAM array can be formed in the metal-2 layer 40 of the device. For some embodiments, the bit lines BL associated with the CAM array can also be formed in the metal-1 layer 30 of the device.

By forming the comparand lines in the metal-1 layer 30, the comparand lines can be more easily connected to the polysilicon gate terminals 22C and 22D of respective pull-down transistors T1 and T3 of compare circuits 330(1) and 330(2), and may have reduced capacitance (e.g., compared to CAM devices in which the comparand lines are formed in the metal-2 layer) because there is not any intermediate metal layer between the metal-1 layer comparand lines and the polysilicon gate terminals 22C and 22D of compare circuit pull-down transistors T1 and T3.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various non-transitory computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

The machine-readable medium may store data representing an integrated circuit design layout that includes embodiments of the present invention. The design layout for the integrated circuit die may be generated using various means, for examples, schematics, text files, gate-level netlists, hardware description languages, layout files, etc. The design layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided.

What is claimed is:

1. A content addressable memory (CAM) device including an array of
    CAM cells arranged in a number of rows and columns, wherein a respective row comprises:
    a match line;
    a first CAM cell coupled to the match line and including a first compare circuit; and
    a second CAM cell coupled to the match line and including a second compare circuit, wherein outputs of the first and second compare circuits are connected together by an interconnect formed in a conductive layer interposed between a polysilicon layer of the CAM device and a metal-1 layer of the CAM device.

2. The CAM device of claim 1, wherein the conductive layer comprises silicide.

3. The CAM device of claim 1, wherein the interconnect does not extend beyond a diffusion region within which the first and second compare circuits are formed.

4. The CAM device of claim 1, wherein the match line is formed in a metal-2 layer of the CAM device.

5. The CAM device of claim 4, wherein the interconnect is connected to the match line by a via extending from the conductive layer through the metal-1 layer to the metal-2 layer.

6. The CAM device of claim 1, further comprising:
    a first comparand line to provide a first comparand bit to the first CAM cell during a compare operation; and
    a second comparand line to provide a second comparand bit to the second CAM cell during the compare operation, wherein the first and second comparand lines are formed in the metal-1 layer.

7. The CAM device of claim 1, further comprising:
    a first bit line to provide a first data bit for storage in the first CAM cell; and
    a second bit line to provide a second data bit for storage in the second CAM cell, wherein the first and second bit lines are formed in the metal-1 layer.

8. The CAM device of claim 1, wherein the first and second CAM cells are adjacent to each other.

9. The CAM device of claim 1, wherein;
    the first compare circuit includes first and second pull-down transistors connected in series between the interconnect and ground potential; and
    the second compare circuit includes third and fourth pull-down transistors connected in series between the interconnect and ground potential, and wherein each of the pull-down transistors has a gate comprising a terminal formed in the polysilicon layer.

10. A content addressable memory (CAM) device including an array having at least one row comprising:
    a match line; and
    a number of pairs of adjacent CAM cells coupled to the match line, wherein a respective pair of adjacent CAM cells comprises:
    a first storage element to store a first data value;
    a first compare circuit coupled to the first storage element and to a first comparand line;
    a second storage element to store a second data value; and a second compare circuit coupled to the second storage element and to a second comparand
wherein the first and second comparand lines are formed in a metal-1 layer of the CAM device.

11. The CAM device of claim 10, wherein the match line is formed in a metal-2 layer of the CAM device.

12. The CAM device of claim 10, further comprising:
an interconnect connected between outputs of the first and second compare circuits and formed in a conductive layer interposed between a polysilicon layer of the CAM device and the metal-1 layer.

13. The CAM device of claim 12, wherein the conductive layer comprises silicide.

14. The CAM device of claim 12, wherein the match line is formed in a metal-2 layer of the CAM device, and wherein the interconnect is connected to the match line by a via extending from the conductive layer through the metal-1 layer to the metal-2 layer.

15. The CAM device of claim 12, wherein the interconnect does not extend beyond a diffusion region within which the first and second compare circuits are formed.

16. The CAM device of claim 10, wherein the first compare circuit comprises:
first and second pull-down transistors, connected in series between the interconnect and ground potential, having gates comprising terminals formed in the polysilicon layer.

17. The CAM device of claim 10, further comprising:
a first bit line to provide a first data bit for storage in the first storage element;
a second bit line to provide a second data bit for storage in the second storage element, wherein the first and second bit lines are formed in the metal-1 layer.

18. A content addressable memory (CAM) device including an array having at least one row comprising:
a first CAM cell comprising:
a first storage cell to store a first data value; and
a first compare circuit coupled to the first storage cell and to a first comparand line;
a second CAM cell comprising:
a second storage cell to store a second data value; and
a second compare circuit coupled to the second storage cell and to a second comparand line; and
an interconnect connected between outputs of the first and second compare circuits, wherein the first and second comparand lines are formed in a metal-1 layer of the CAM device,
and the interconnect is formed in a conductive layer interposed between a polysilicon layer of the CAM device and the metal-1 layer.

19. The CAM device of claim 18, wherein the conductive layer comprises silicide.

20. The CAM device of claim 18, wherein the interconnect does not extend beyond a diffusion region within which the first and second compare circuits are formed.

21. The CAM device of claim 18, further comprising:
a match line extending across the at least one row and coupled to the first and second CAM cells, wherein the match line is formed in a metal-2 layer of the CAM device.

22. The CAM device of claim 18, wherein the interconnect is connected to the match line by a via extending from the conductive layer through the metal-1 layer to the metal-2 layer.

23. The CAM device of claim 18, further comprising:
a first bit line to provide a first data bit for storage in the first CAM cell; and
a second bit line to provide a second data bit for storage in the second CAM cell, wherein the first and second hit lines are formed in the metal-1 layer.

24. The CAM device of claim 18, wherein the first and second CAM cells are adjacent to each other.

25. The CAM device of claim 18, wherein:
the first compare circuit includes first and second pull-down transistors connected in series between the interconnect and ground potential; and
the second compare circuit includes third and fourth pull-down transistors connected in series between the interconnect and ground potential, and wherein each of the pull-down transistors has a gate comprising a terminal formed in the polysilicon layer.

\* \* \* \* \*

UNITED STATES PATENT AND TRADEMARK OFFICE
CERTIFICATE OF CORRECTION

PATENT NO. : 8,730,704 B1  
APPLICATION NO. : 13/371236  
DATED : May 20, 2014  
INVENTOR(S) : Nataraj et al.

Page 1 of 1

It is certified that error appears in the above-identified patent and that said Letters Patent is hereby corrected as shown below:

In the Claims

Column 10, line 49, claim 9, please replace ";" with --:--.

Column 11, line 2, claim 10, please insert --line,-- after --comparand--.

Column 12, line 28, claim 23, please replace "hit" with --bit--.

Signed and Sealed this  
Twenty-sixth Day of August, 2014

Michelle K. Lee  
*Deputy Director of the United States Patent and Trademark Office*